United States Patent
Hu et al.

(10) Patent No.: US 11,848,393 B2
(45) Date of Patent: Dec. 19, 2023

(54) PHOTODIODE AND DISPLAY SCREEN

(71) Applicant: WUHAN CHINA STAR OPTOELECTRONICS TECHNOLOGY CO., LTD, Wuhan (CN)

(72) Inventors: Li Hu, Wuhan (CN); Tengteng Shi, Wuhan (CN); Guowei Zha, Wuhan (CN); Wei Luo, Wuhan (CN)

( * ) Notice: Subject to any disclaimer, the term of this patent is extended or adjusted under 35 U.S.C. 154(b) by 701 days.

(21) Appl. No.: 16/970,396

(22) PCT Filed: Jun. 12, 2020

(86) PCT No.: PCT/CN2020/095708
§ 371 (c)(1),
(2) Date: Aug. 17, 2020

(87) PCT Pub. No.: WO2021/139090
PCT Pub. Date: Jul. 15, 2021

(65) Prior Publication Data
US 2023/0111648 A1   Apr. 13, 2023

(30) Foreign Application Priority Data
Jan. 6, 2020   (CN) .......................... 202010008948.7

(51) Int. Cl.
*H01L 31/0224*   (2006.01)
*H01L 31/0232*   (2014.01)
*H01L 31/08*   (2006.01)
*G06V 40/13*   (2022.01)
*H01L 31/105*   (2006.01)

(52) U.S. Cl.
CPC ............... *H01L 31/022466* (2013.01); *H01L 31/02327* (2013.01); *H01L 31/022408* (2013.01); *H01L 31/08* (2013.01); *G06V 40/1318* (2022.01); *H01L 31/105* (2013.01)

(58) Field of Classification Search
None
See application file for complete search history.

(56) References Cited

U.S. PATENT DOCUMENTS

| 6,280,895 B1 | 8/2001 | Ueda et al. |
| 2009/0218595 A1* | 9/2009 | Ishimura ............ H01L 31/02327 257/E31.119 |
| 2016/0211392 A1* | 7/2016 | So ......................... H01L 31/101 |

FOREIGN PATENT DOCUMENTS

| CN | 1161476 A | 10/1997 |
| CN | 104904014 A | 9/2015 |
| CN | 106684202 A | 5/2017 |
| CN | 107275434 A | 10/2017 |
| CN | 107507928 A | 12/2017 |
| CN | 110085742 A | 8/2019 |
| CN | 111106189 A | 5/2020 |

(Continued)

*Primary Examiner* — Evren Seven

(57) ABSTRACT

The present invention provides a photodiode and a display screen. The photodiode includes a first electrode and a second electrode in order. When a direction of an incident light of the photodiode is a first direction, a material of the first electrode is a transparent conductive material, and a material of the second electrode is a metal material. When the direction of the incident light of the photodiode is a second direction, the second electrode is made of a transparent conductive material, and the first electrode is made of a metal material.

14 Claims, 6 Drawing Sheets

(56) References Cited

FOREIGN PATENT DOCUMENTS

| | | |
|---|---|---|
| CN | 111180532 A | 5/2020 |
| JP | 2011014841 A | 1/2011 |
| KR | 20190103706 A | 9/2019 |
| WO | 2019082852 A1 | 5/2019 |

* cited by examiner

PHOTODIODE AND DISPLAY SCREEN

FIELD OF INVENTION

The present invention relates to the field of display technologies, and in particular, to a photodiode and a display screen.

BACKGROUND OF INVENTION

In-screen fingerprint recognition use photoelectric sensor arrays integrated in display screens to obtain fingerprint patterns. Currently, the photoelectric sensors mostly use photodiodes.

However, as shown in FIG. 1, current photodiodes comprise a first electrode 11, a p-doped layer 12, a light conversion layer 13, an n-doped layer 14, and a second electrode 15. Since the p-doped layer and the n-doped layer absorb a part of light, a light absorption rate of the light conversion layer 13 is low, thereby reducing photoelectric conversion efficiency.

Therefore, it is necessary to provide a photodiode and a display screen to solve problems existing in the prior art.

TECHNICAL PROBLEM

An objective of the present invention is to provide a photodiode and a display screen, which can improve a light absorption rate and photoelectric conversion efficiency of a light conversion layer.

In order to solve above technical problems, the present invention provides a photodiode, comprising:
  a first electrode;
  an electron transport layer disposed on the first electrode;
  a light conversion layer disposed on the electron transport layer;
  a hole transport layer disposed on the light conversion layer; and
  a second electrode disposed on the hole transport layer;
  wherein when a direction of an incident light of the photodiode is a first direction, the first electrode is made of a transparent conductive material, and the second electrode is made of a metal material; and
  wherein when the direction of the incident light of the photodiode is a second direction, the second electrode is made of a transparent conductive material, and of the first electrode is made of a metal material.

The present invention further provides a display screen comprising a plurality of the above-mentioned photodiodes.

The photodiode and the display screen of the present invention comprises a photodiode, wherein the photodiode comprises: a first electrode; an electron transport layer disposed on the first electrode; a light conversion layer disposed on the electron transport layer; a hole transport layer disposed on the light conversion layer; and a second electrode disposed on the hole transport layer; wherein when a direction of an incident light of the photodiode is a first direction, the first electrode is made of a transparent conductive material, and the second electrode is made of a metal material; and wherein when the direction of the incident light of the photodiode is a second direction, the second electrode is made of a transparent conductive material, and the first electrode is mad of a metal material. Since a bottom electrode is made of a transparent conductive material and a top electrode is made of a metal material, light received by the light conversion layer can be increased, thereby improving a light absorption rate and photoelectric conversion efficiency.

DETAILED DESCRIPTION OF PREFERRED EMBODIMENTS

The following description of the various embodiments is provided with reference to the accompanying drawings. Directional terms, such as upper, lower, front, back, left, right, inner, outer, and lateral side, mentioned in the present invention are only for reference. Therefore, the directional terms are used for describing and understanding rather than limiting the present invention. In the figures, units having similar structures are used for the same reference numbers.

The terms "first" and "second" in the specification and claims of the present invention and the above-mentioned drawings are used to distinguish different objects, and are not used to describe a specific order. Furthermore, the terms "including" and "having" and any variations thereof are intended to cover non-exclusive inclusion.

Figure 1:
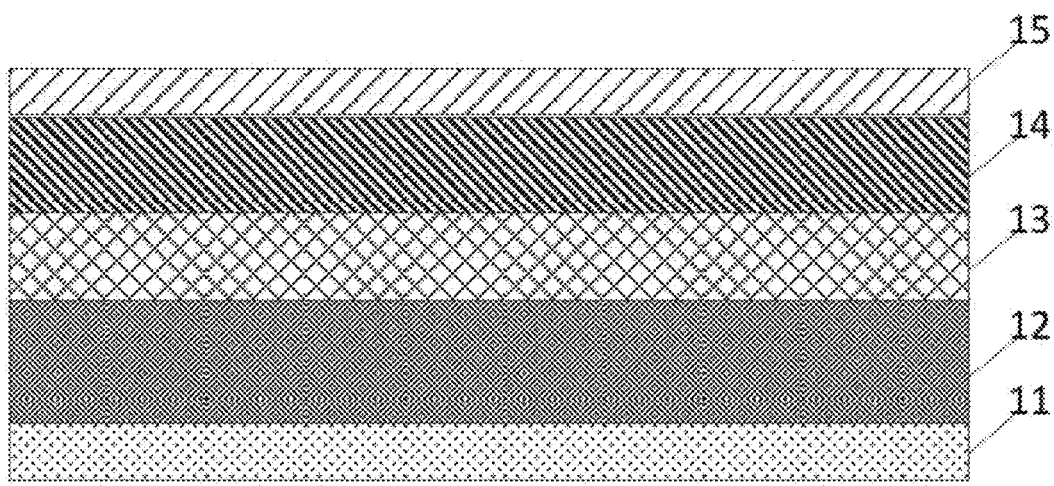
FIG. 1 is a schematic structural view of a conventional photodiode.
Figure 2:
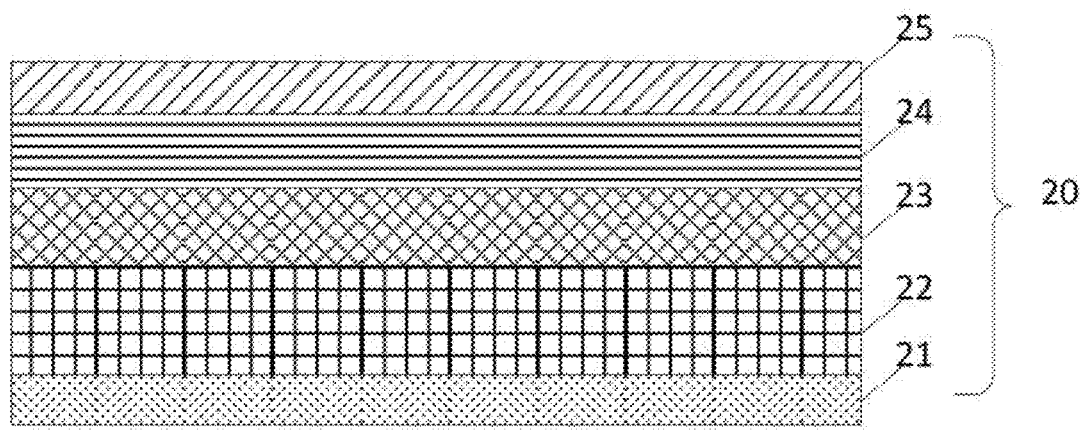
FIG. 2 is a schematic structural view of a photodiode according to the present invention.

Please refer to FIG. 2 to FIG. 6. FIG. 2 is a schematic structural diagram of a photodiode according to the present invention.

As shown in FIG. 2, a photodiode 20 of the present invention comprises a first electrode 21, an electron transport layer 22, a light conversion layer 23, a hole transport layer 24, and a second electrode 25.

The electron transport layer 22 is disposed on the first electrode 21.

The light conversion layer 23 is disposed on the electron transport layer 22, and the light conversion layer 23 is preferably made of amorphous silicon. Since amorphous silicon has better light absorption in short wavelengths, it can further increase light absorption. In an embodiment, in order to further increase a light absorption rate, a thickness of the light conversion layer 23 ranges from 40 nm to 1500 nm.

The hole transport layer 24 is disposed on the light conversion layer 23. In an embodiment, in order to further increase the light absorption rate, a thickness of the electron transport layer 24 and a thickness of the hole transport layer 22 may range from 20 nm to 300 nm. In an embodiment, in order to further improve the light absorption rate, materials of the hole transport layer 24 and the electron transport layer 22 comprise, but are not limited to, molybdenum oxide, zinc oxide, tungsten oxide, nickel oxide, titanium oxide, organic semiconductor materials, C60, ICBA, and BCP (mosaic copolymer).

The second electrode 25 is disposed on the hole transport layer 24. When a direction of an incident light of the photodiode is a first direction, wherein the first direction is from bottom to top, i.e., when it is incident from the bottom, the first electrode 21 is made of a transparent conductive material, and the second electrode 25 is made of a metal material. That is, currently, the second electrode 25 is a top electrode, the first electrode 21 is a bottom electrode, and the second electrode 25 has a reflection function. For example, the second electrode 25 may select a transparent ultra-thin metal thin film as the electrode, and the metal material may also select other metal materials. In an embodiment, in order to increase an ability to reflect light, the metal material comprises but is not limited to at least one of molybdenum and titanium. The transparent conductive material may comprise, but is not limited to, a transparent conductive oxide, and the transparent conductive material may comprise at least one of ITO and IZO. In an embodiment, in order to further increase the light absorption rate, a thickness of the first electrode 21 and a thickness of the second electrode 25 both range from 40 nm to 300 nm.

When the direction of the incident light of the photodiode is a second direction, where the second direction is, for example, from top to bottom, that is, when it is incident from the top, i.e., the first electrode 21 is the top electrode and the second electrode 25 is the bottom electrode. The second electrode 25 is made of a transparent conductive material, and the first electrode 21 is made of a metal material. The metal material may be the above-mentioned metal material, and the transparent conductive material may also be the above-mentioned transparent conductive material.

Since the top electrode is the metal material and the bottom electrode is the transparent conductive material, light is transmitted to the light conversion layer through the bottom electrode, and all the light can be reflected to the light conversion layer without being transmitted through the top electrode. Therefore, the light received by the light conversion layer is increased, thereby improving the light absorption rate and photoelectric conversion efficiency.

In order to further improve the light absorption rate, an absorption peak of the photodiode 20 is disposed in a first band range or a second band range. In an embodiment, the first band is, for example, a blue light band, and the second band is, for example, a green light band. Of course, the first band and the second band are not limited to herein, and can be specifically set according to requirements.

In an embodiment, when the direction of the incident light of the photodiode 20 is the first direction, wherein the first direction is, for example, from bottom to top, the thickness of the first electrode 21 and the thickness of the electron transport layer 22 satisfy a first default condition, and the absorption peak of the photodiode 20 is in the first band range; and when the thickness of the first electrode 21 and the thickness of the electron transport layer 22 satisfy a second default condition, the absorption peak of the photodiode 20 is in the second band range.

For example, when the thickness of the first electrode 21 ranges from 160 nm to 190 nm and the thickness of the electron transport layer 22 ranges from 140 nm to 180 nm, the absorption peak of the entire photodiode is in a range of the blue light band. When the thickness of the first electrode 21 ranges from 210 nm to 230 nm and the thickness of the electron transport layer 22 ranges from 195 nm to 215 nm, the absorption peak of the entire photodiode is in a range of the green light band.

Figure 3:
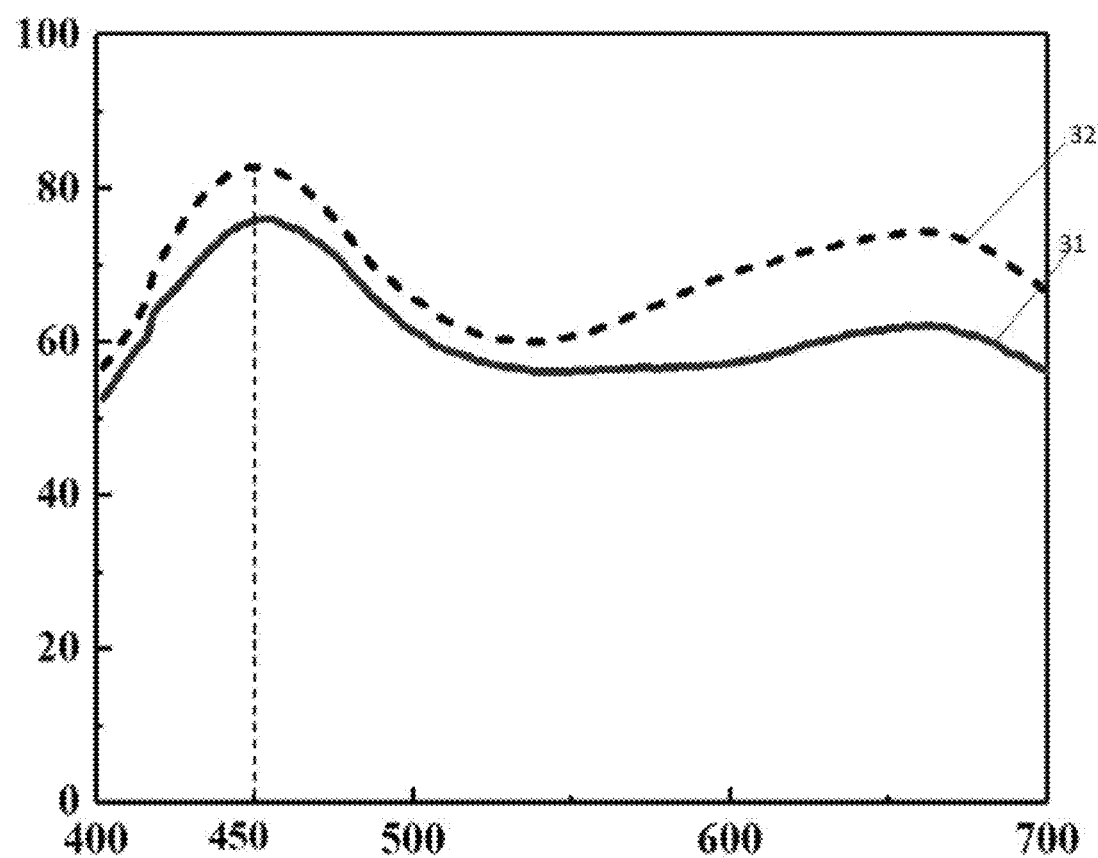
FIG. 3 is a first spectrogram of the photodiode according to the present invention.

In an embodiment, taking the first electrode 21 is made of ITO and the electron transport layer 22 is made of zinc oxide as an example. As shown in FIG. 3 to FIG. 6, in FIG. 3 to FIG. 6, an abscissa indicates a wavelength, the unit is nm, and an ordinate indicates an absorptivity (%). As shown in FIG. 3, 31 represents an absorptivity of the light conversion layer, and 32 represents the absorptivity of the photodiode. When the thickness of the first electrode 21 is 175 nm and the thickness of the electron transport layer 22 is 165 nm, the absorption peak of the entire photodiode is 450 nm, that is, it is in the range of the blue light band.

Figure 4:
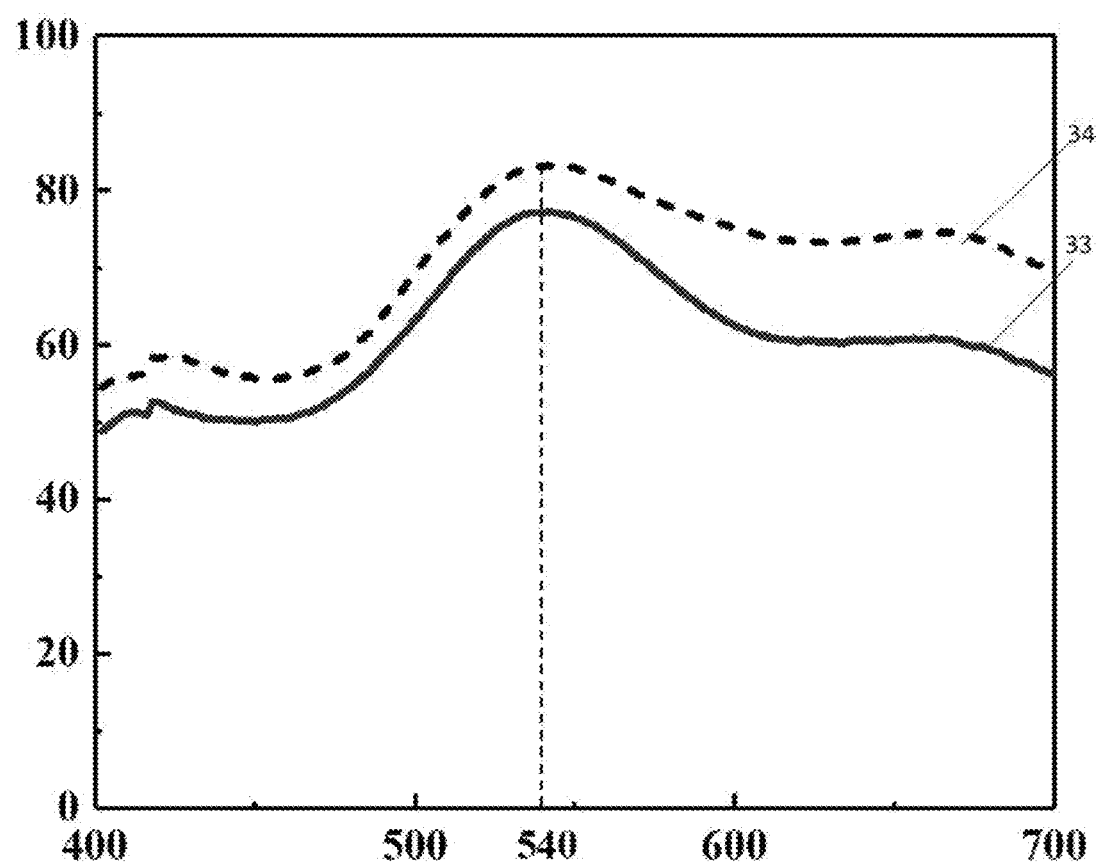
FIG. 4 is a second spectrogram of the photodiode according to the present invention.

As shown in FIG. 4, 33 represents the absorptivity of the light conversion layer, and 34 represents the absorptivity of the photodiode. When the thickness of the first electrode 21 is 222 nm and the thickness of the electron transport layer 22 is 204 nm, the absorption peak of the entire photodiode is 540 nm, that is, it is in the range of the green light band.

In another embodiment, when the direction of the incident light of the photodiode 20 is the second direction, wherein the second direction is from top to bottom, the thickness of the second electrode 25 and the thickness of the electron transport layer 22 satisfy a third default condition, and the absorption peak of the photodiode 20 is in the first band range. When the thickness of the second electrode 25 and the thickness of the electron transport layer 22 satisfy a fourth default condition, the absorption peak of the photodiode 20 is in the second band range.

For example, in an embodiment, when the thickness of the second electrode 25 ranges from 95 nm to 110 nm and the thickness of the electron transport layer 22 ranges from 45 nm to 55 nm, the absorption peak of the entire photodiode is in the range of the blue light band.

When the thickness of the second electrode 25 ranges from 135 nm to 150 nm and the thickness of the electron transport layer 22 ranges from 55 nm to 65 nm, the absorption peak of the entire photodiode is in the range of the green light band.

Figure 5:
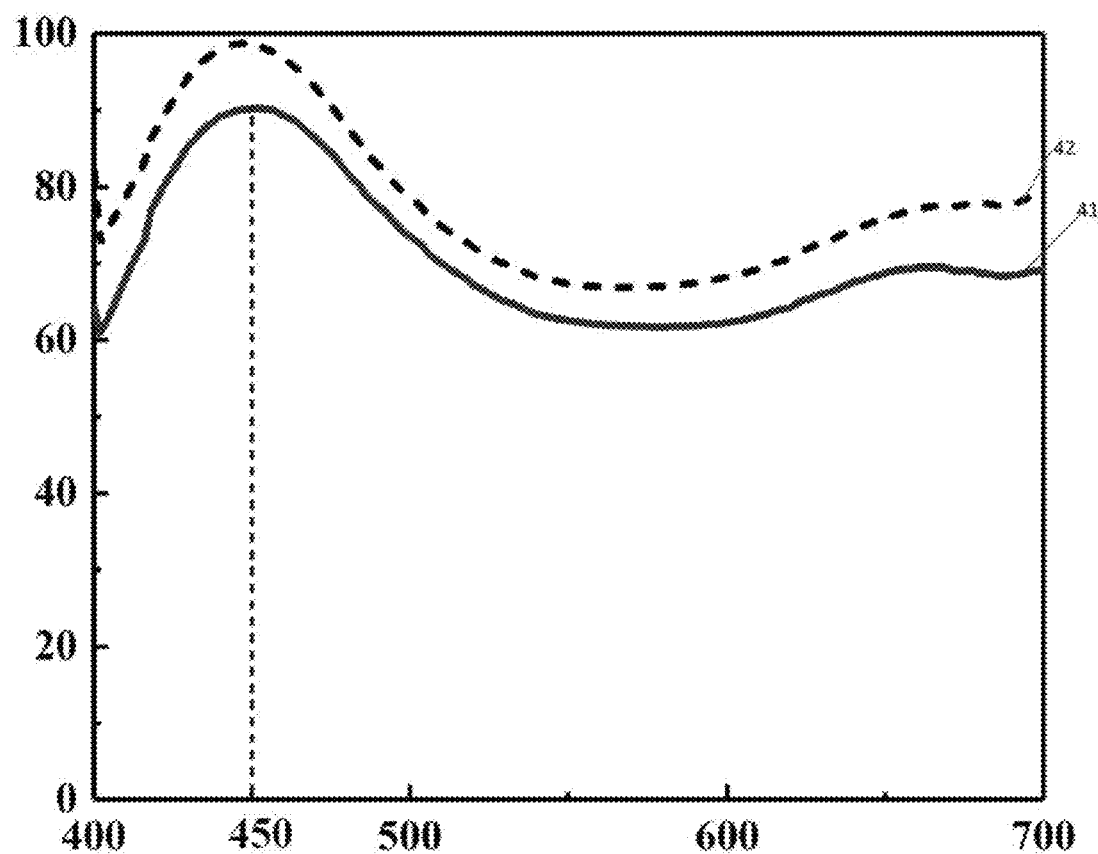
FIG. 5 is a third spectrogram of the photodiode according to the present invention.

Taking the second electrode 25 is made of ITO and the electron transport layer 22 is made of zinc oxide as an example, as shown in FIG. 5, 41 represents the absorptivity of the light conversion layer, and 42 represents the absorptivity of the photodiode. When the thickness of the second electrode 25 is 104 nm and the thickness of the electron transport layer 22 is 50 nm, the absorption peak of the entire photodiode is 450 nm, that is, it is in the range of the blue light band.

Figure 6:
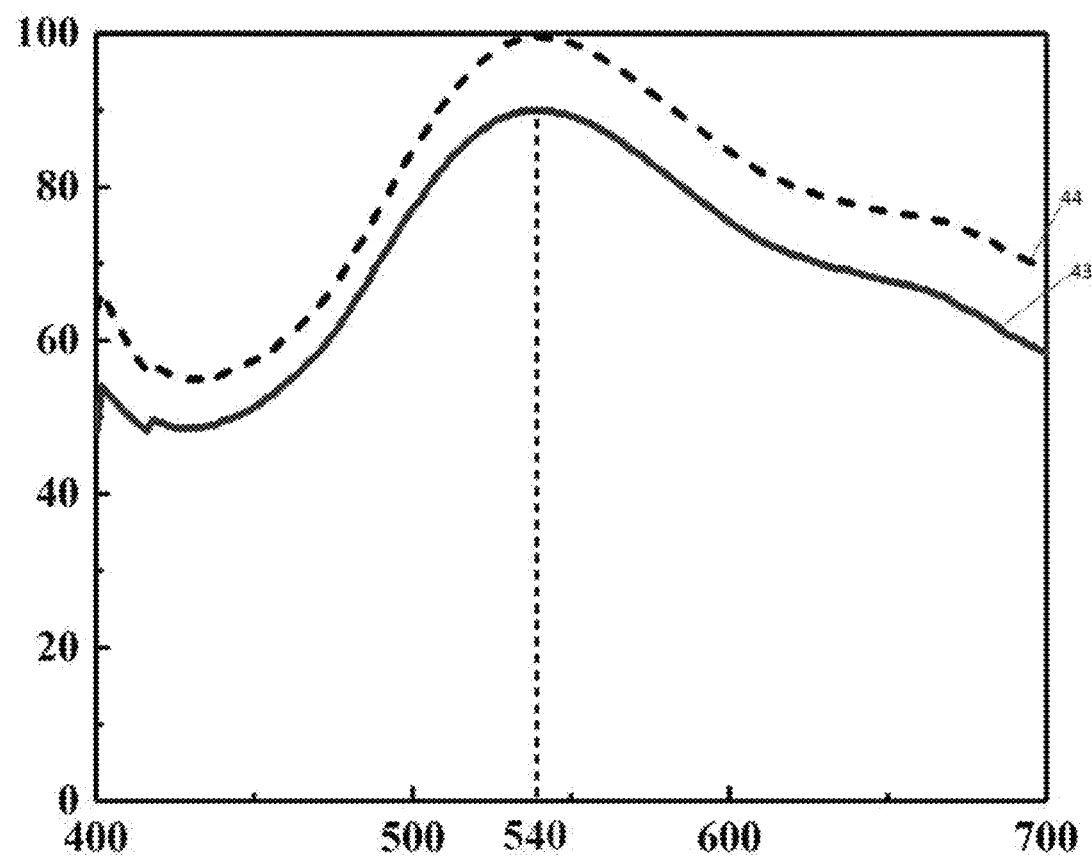
FIG. 6 is a fourth spectrogram of the photodiode according to the present invention.

As shown in FIG. 6, 43 represents the absorptivity of the light conversion layer, and 44 represents the absorptivity of the photodiode. When the thickness of the second electrode 25 is 143 nm and the thickness of the electron transport layer 22 is 60 nm, the absorption peak of the entire photodiode is 540 nm, that is, it is in the range of the green light band.

Taking the light conversion layer is amorphous silicon as an example, the above photodiode uses amorphous silicon as a photosensitive material. When the light enters the amorphous silicon layer from an outside, photons are converted into electron-hole pairs, and the electron-hole pairs are separated. The electrons and holes are collected by the first electrode and the second electrode, respectively, thereby generating a photocurrent. In an embodiment, the first electrode is an anode and the second electrode is a cathode.

The present invention further provides a display screen, which comprises a plurality of any one of the photodiodes described above. A plurality of the photodiodes forms a photo sensor array. In addition, the display screen may further comprise a display panel disposed under the photodiodes. The display panel may comprise a switch array layer, and the switch array layer comprises a plurality of thin film transistors.

When fingers press on the screen, intensity of reflected light corresponding to protrusions and depressions in fingerprints is different, so a distribution of the photocurrent in an entire sensor array can be obtained, and a fingerprint pattern can be obtained. In the sensor array, each pixel has a capacitor to store a charge in the photocurrent, and the stored charge will be read by an external circuit. By obtaining the distribution of the charge size in the storage capacitors in the entire array, a distribution information of the light intensity on the panel can be obtained, and fingerprint information can be obtained based on the distribution information of the light intensity. Because the photodiode of the present invention has a high light absorption rate, accuracy of the fingerprint information is further improved.

The photodiode and the display screen of the present invention comprises a photodiode, wherein the photodiode comprises: a first electrode; an electron transport layer disposed on the first electrode; a light conversion layer disposed on the electron transport layer; a hole transport layer disposed on the light conversion layer; and a second electrode disposed on the hole transport layer; wherein when a direction of an incident light of the photodiode is a first direction, the first electrode is made of a transparent conductive material, and the second electrode is made of a metal material; and wherein when the direction of the incident light of the photodiode is a second direction, the second electrode is made of a transparent conductive material, and the first electrode is mad of a metal material. Since a bottom electrode is made of a transparent conductive material and a top electrode is made of a metal material, light received by the light conversion layer can be increased, thereby improving a light absorption rate and photoelectric conversion efficiency.

In the above, various other corresponding changes and modifications can be made according to the technical solutions and technical ideas of the present invention to those skilled in the art, and all such changes and modifications are within the scope of the claims of the present invention.

What is claimed is:

1. A photodiode, comprising:
   a first electrode;
   an electron transport layer disposed on the first electrode;
   a light conversion layer disposed on the electron transport layer;
   a hole transport layer disposed on the light conversion layer; and
   a second electrode disposed on the hole transport layer, wherein an absorption peak of the photodiode is in a first band range or a second band range;
   wherein when a direction of an incident light of the photodiode is a first direction, the first electrode is made of a transparent conductive material, and the second electrode is made of a metal material, wherein when the direction of the incident light of the photodiode is the first direction, a thickness of the first electrode and a thickness of the electron transport layer satisfy a first default condition, the absorption peak of the photodiode is in the first band range, the thickness of the first electrode ranges from 160 nm to 190 nm, and the thickness of the electron transport layer ranges from 140 nm to 180 nm;
   wherein when the thickness of the first electrode and the thickness of the electron transport layer satisfy a second default condition, the absorption peak of the photodiode is in the second band range; and
   wherein when the direction of the incident light of the photodiode is a second direction, the second electrode is made of a transparent conductive material, and of the first electrode is made of a metal material.

2. The photodiode as claimed in claim 1, wherein the metal material comprises, but is not limited to, at least one of molybdenum and titanium.

3. The photodiode as claimed in claim 1, wherein when the thickness of the first electrode and the thickness of the electron transport layer satisfy the second default condition, the thickness of the first electrode ranges from 210 nm to 230 nm, and the thickness of the electron transport layer ranges from 195 nm to 215 nm.

4. The photodiode as claimed in claim 1, wherein when the direction of the incident light of the photodiode is the second direction, and a thickness of the second electrode and the thickness of the electron transport layer satisfy a third default condition, the absorption peak of the photodiode is in the first band range; and
   wherein when the thickness of the second electrode and the thickness of the electron transport layer satisfy a fourth default condition, the absorption peak of the photodiode is in the second band range.

5. The photodiode as claimed in claim 4, wherein when the thickness of the second electrode and the thickness of the electron transport layer satisfy the third default condition, the thickness of the second electrode ranges from 95 nm to 110 nm, and the thickness of the electron transport layer ranges from 45 nm to 55 nm.

6. The photodiode as claimed in claim 4, wherein when the thickness of the second electrode and the thickness of the electron transport layer satisfy the fourth default condition, the thickness of the second electrode ranges from 135 nm to 150 nm, and the thickness of the electron transport layer ranges from 55 nm to 65 nm.

7. The photodiode as claimed in claim 1, wherein the thickness of the first electrode and the thickness of the second electrode both range from 40 nm to 300 nm.

8. The photodiode as claimed in claim 1, wherein the thickness of the electron transport layer and a thickness of the hole transport layer both range from 20 nm to 300 nm.

9. The photodiode as claimed in claim 1, wherein a thickness of the light conversion layer ranges from 40 nm to 1500 nm.

10. A display screen, comprising:
    a photodiode, wherein the photodiode comprises:
    a first electrode;
    an electron transport layer disposed on the first electrode;
    a light conversion layer disposed on the electron transport layer;
    a hole transport layer disposed on the light conversion layer; and
    a second electrode disposed on the hole transport layer, wherein an absorption peak of the photodiode is in a first band range or a second band range;
    wherein when a direction of an incident light of the photodiode is a first direction, the first electrode is made of a transparent conductive material, and the second electrode is made of a metal material, wherein when the direction of the incident light of the photodiode is the first direction, a thickness of the first electrode and a thickness of the electron transport layer satisfy a first default condition, the absorption peak of the photodiode is in the first band range, the thickness of the first electrode ranges from 160 nm to 190 nm, and the thickness of the electron transport layer ranges from 140 nm to 180 nm;
    wherein when the thickness of the first electrode and the thickness of the electron transport layer satisfy a second default condition, the absorption peak of the photodiode is in the second band range, the thickness of the first electrode ranges from 210 nm to 230 nm, and the thickness of the electron transport layer ranges from 195 nm to 215 nm; and wherein when the direction of the incident light of the photodiode is a second direction, the second electrode is made of a transparent conductive material, and the first electrode is mad of a metal material.

11. The display screen as claimed in claim 10, wherein the metal material comprises, but is not limited to, at least one of molybdenum and titanium.

12. The display screen as claimed in claim 10, wherein when the direction of the incident light of the photodiode is the second direction, and a thickness of the second electrode and the thickness of the electron transport layer satisfy a third default condition, the absorption peak of the photodiode is in the first band range; and wherein when the thickness of the second electrode and the thickness of the electron transport layer satisfy a fourth default condition, the absorption peak of the photodiode is in the second band range.

13. The display screen as claimed in claim 12, wherein when the thickness of the second electrode and the thickness of the electron transport layer satisfy the third default condition, the thickness of the second electrode ranges from 95 nm to 110 nm, and the thickness of the electron transport layer ranges from 45 nm to 55 nm; and wherein when the thickness of the second electrode and the thickness of the electron transport layer satisfy the fourth default condition, the thickness of the second electrode ranges from 135 nm to 150 nm, and the thickness of the electron transport layer ranges from 55 nm to 65 nm.

14. The display screen as claimed in claim 10, wherein the thickness of the first electrode and the thickness of the second electrode both range from 40 nm to 300 nm.

* * * * *